(12) United States Patent
Tanaka

(10) Patent No.: US 7,371,680 B2
(45) Date of Patent: May 13, 2008

(54) METHOD OF MANUFACTURING SEMICONDUCTOR DEVICE

(75) Inventor: Katsuhiko Tanaka, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 286 days.

(21) Appl. No.: 11/211,531

(22) Filed: Aug. 26, 2005

(65) Prior Publication Data
US 2006/0046457 A1    Mar. 2, 2006

(30) Foreign Application Priority Data
Aug. 26, 2004 (JP) ............................. 2004-247443

(51) Int. Cl.
*H01L 21/4763* (2006.01)
(52) U.S. Cl. ............... 438/648; 438/597; 438/685; 257/E21.495
(58) Field of Classification Search ............... 438/648, 438/685; 257/E21.495
See application file for complete search history.

(56) References Cited

U.S. PATENT DOCUMENTS

| | | | |
|---|---|---|---|
| 5,726,096 A | * | 3/1998 | Jung .......................... 438/592 |
| 5,731,225 A | * | 3/1998 | Yamamori ................. 438/653 |
| 5,795,824 A | * | 8/1998 | Hancock ..................... 438/656 |
| 6,429,126 B1 | * | 8/2002 | Herner et al. ............... 438/680 |
| 6,489,239 B1 | | 12/2002 | Jang et al. |
| 2003/0157797 A1 | * | 8/2003 | Herner ....................... 438/652 |

FOREIGN PATENT DOCUMENTS

| | | |
|---|---|---|
| JP | 8-306781 | 11/1996 |
| JP | 2000-077417 | 3/2000 |
| JP | 2000-133715 | 5/2000 |
| JP | 2001-210711 | 8/2001 |
| JP | 2002-093746 | 3/2002 |
| JP | 2003-022985 | 1/2003 |

* cited by examiner

*Primary Examiner*—Michael Lebentritt
*Assistant Examiner*—Angel Roman
(74) *Attorney, Agent, or Firm*—Young & Thompson

(57) ABSTRACT

A method of manufacturing a semiconductor device is achieved by forming an interlayer insulating film on a conductive portion formed in a semiconductor substrate which is placed in a chamber. A contact hole is formed to pass through the interlayer insulating film to the conductive portion, and a barrier metal layer is formed to cover a bottom portion of side wall portion of the contact hole. A tungsten layer is formed from a material gas containing fluorine and the fluorine is removed from the tungsten layer through a post purge process. The tungsten layer is formed to fill the contact hole in which the barrier metal layer has been formed.

16 Claims, 8 Drawing Sheets

METHOD OF MANUFACTURING SEMICONDUCTOR DEVICE

BACKGROUND OF THE INVENTION

1. Field of the Invention

The present invention relates to a manufacturing method of a semiconductor device.

2. Description of the Related Art

In manufacturing a semiconductor device, there is a case that an interlayer insulating film is formed on a semiconductor substrate (a metal interconnection, a $P^+$-type silicon substrate and an $N^+$-type silicon substrate), and a contact hole is formed to pass through the interlayer insulating film. In this case, a barrier metal layer is sometimes formed in a bottom portion and a sidewall portion of the contact hole. An interconnection plug or a contact plug is formed in the contact hole in which the barrier metal layer has been formed. In recent years, metals exemplified by tungsten (W), titanium (Ti), cobalt (Co), aluminum (Al), and copper (Cu) are mainly used as a material for the interconnection plug of the semiconductor device. In forming the interconnection plug, tungsten of these metals is predominantly used in a CVD method, whereas aluminum and copper are mainly used in a sputtering method. Especially, tungsten is frequently used for its performance and convenience of usage.

In forming a tungsten layer for the interconnection plug by the CVD method, a tungsten hexafluoride ($WF_6$) gas is used as a gas halide, and a hydrogen ($H_2$) gas and a silane ($SiH_4$) gas are used as reducing gas. In this case, the tungsten layer contains a high concentration of fluorine (approximately $1.2 \times 10^{20}$ $atm/cm^3$), since the gas halide ($WF_6$ gas) is used. For example, when a tungsten plug is formed on a metal interconnection layer, fluorine contained the tungsten plug reacts with the metal interconnection layer in the interface between the metal interconnection layer and the barrier metal layer to increase interface resistance.

In conjunction with the above description, a wiring method is disclosed in Japanese Laid Open Patent Application (JP-P2000-77417A). In this conventional example, a barrier metal layer is formed on a semiconductor substrate, and a metal layer is formed on the barrier metal layer by a chemical vapor deposition method by using a source gas containing a fluorine component. Then, a metal layer pattern is formed by etching the metal layer, and residual fluorine in the barrier metal layer is removed by applying a hydrogen plasma process.

Also, a method of manufacturing a tungsten layer in a semiconductor device is disclosed in Japanese Laid Open Patent Application (JP-P2000-133715A). In this conventional example, an interface metal film formed on a semiconductor substrate is processed by using a $SiH_4$ gas with the pressure of 5.2 KPa or above, and a tungsten seed layer is formed on the processed boundary metal film by using the $WF_6$ gas and the $SiH_4$ gas, in which a flow ratio on the interface metal layer surface is $[WF_6]/[SiH_4] \leq 1$. Then, a tungsten layer is formed by using the $WF_6$ gas on the interface metal film on which the tungsten seed layer has been formed.

Also, a method of manufacturing a semiconductor device is disclosed in Japanese Laid Open Patent Application (JP-A-Heisei 08-306781). In this conventional example, an interlayer insulating film is formed on a semiconductor substrate, and an opening is formed in a predetermined position of the interlayer insulating film. Then, a barrier layer containing titanium nitride is formed in a whole area including the opening, and a tungsten layer is formed to fill the opening by a chemical vapor deposition method. Subsequently, the tungsten layer is etched by using a gas containing fluorine as a reactive gas in a first chamber to remain the tungsten layer only in the opening, and then a wafer is transferred from the first chamber to a second chamber without breaking a vacuum. Subsequently, fluorine adhered on the substrate surface is removed in the second chamber.

Also, a method of forming a conductive plug in a contact hole with a high aspect ratio is disclosed in Japanese Laid Open Patent Application (JP-P2002-93746A). In this conventional example, the conductive plug is formed in a through-hole or a contact hole by introducing a reactive gas into a chamber. At this time, the deposition of a conductive film is promoted by introducing the reactive gas into the chamber. Also, the gas in the chamber is exhausted. Then, the introduction and the exhaustion are alternately repeated.

Also, a method of manufacturing a semiconductor device is disclosed in Japanese Laid Open Patent Application (JP-P2003-22985A). In this conventional example, a $CoSi_2$ layer is formed in a predetermined region on a silicon substrate, and an insulating film is deposited on the whole silicon substrate. A contact hole is formed to pass through the insulating film to the $CoSi_2$ layer, and a titanium film is deposited by a sputtering method to cover the inside of the contact hole. Subsequently, a titanium nitride film containing carbon is deposited on the titanium film by using an organic titanium material by a chemical vapor deposition method. Then, carbon is removed from the titanium nitride film at least by exposing the surface of the titanium nitride film to plasma of hydrogen or nitrogen. Subsequently, a tungsten layer is deposited on the titanium nitride film by using a tungsten hexafluoride gas and a monosilane gas by the chemical vapor deposition method. At this time, the film thickness of the titanium nitride film deposited once is set to be equal to or less than such a thickness that moisture to be absorbed into the film when being exposed to the atmosphere can be restricted. Also, the deposition of the titanium nitride film and the removal of carbon are repeated several times to form the titanium nitride film with a desired film thickness.

Also, a method of manufacturing a semiconductor device is disclosed in Japanese Laid Open Patent Application (JP-P2001-210711A). In this conventional example, a first interlayer insulating film is formed on a silicon substrate, and an opening is formed in the first insulating film. Then, a Si plug is formed in the opening by filling a Si layer in the first interlayer insulating film. Then, a silicide pad is formed on an upper end of the silicon plug in a self-alignment to have a diameter larger than that of the opening. An upper surface of the silicide pad is positioned above an upper surface of the first interlayer insulating film.

SUMMARY OF THE INVENTION

An object of the present invention is to provide a method of manufacturing a semiconductor device that can restrict increase of the resistance of a tungsten plug.

In an aspect of the present invention, a method of manufacturing a semiconductor device is achieved by forming an interlayer insulating film on a conductive portion formed in a semiconductor substrate which is placed in a chamber; by forming a contact hole to pass through the interlayer insulating film to the conductive portion; by forming a barrier metal layer to cover a bottom portion of side wall portion of the contact hole; by forming a tungsten layer from a material gas containing fluorine and by removing the fluorine from the tungsten layer through a post purge process. The tungsten layer is formed to fill the contact hole in which the barrier metal layer has been formed.

Here, the post purge process may be achieved by introducing a silicon hydride gas and a hydrogen gas into the chamber.

Also, the forming a tungsten layer may be achieved by introducing an inert gas into the chamber for a first gas purge; by introducing a hydrogen gas and a silicon hydride gas into the chamber for a second gas purge after the first gas purge; by forming a first tungsten layer of the tungsten layer from a tungsten fluoride gas after the second gas purge; by introducing the hydrogen gas and the inert gas into the chamber for a third gas purge after the first tungsten layer is formed; and by forming a second tungsten layer of the tungsten layer on the first tungsten layer from the tungsten fluoride gas after the third gas purge.

In this case, the forming a first tungsten layer may be achieved by introducing the silicon hydride gas and the tungsten fluoride gas into the chamber, and the forming a second tungsten layer may be achieved by introducing the hydrogen gas and the tungsten fluoride gas into the chamber.

Also, the removing may be achieved by introducing the hydrogen gas and the inert gas into the chamber for a fourth gas purge; by introducing the hydrogen gas and the silicon hydride gas into the chamber for the post purge process to form a silicon layer on the tungsten layer such that silicon in the silicon layer reacts with fluorine in the tungsten layer to form a silicon fluoride layer, after the fourth gas purge; by introducing the hydrogen gas and the inert gas into the chamber for a fifth gas purge; and by removing the silicon fluoride layer after the fifth gas purge.

Also, the temperature of the semiconductor substrate in the post purge process may be in a range from 250° C. to 500° C. Also, the gas pressure of the silicon hydride gas in the post purge process may be in a range from 0.1 torr to 3 torr. In addition, the process time of the post purge process is in a range from 3 seconds to 20 seconds.

Also, the silicon hydride gas may be a monosilane ($SiH_4$) gas or a disilane ($Si_2H_6$) gas. The tungsten fluoride gas may be a tungsten hexafluoride ($WF_6$) gas. The inert gas may be any of a helium gas, a neon gas, an argon gas, a krypton gas, a xenon gas and a radon gas.

DESCRIPTION OF THE PREFERRED EMBODIMENTS

Figure 1:
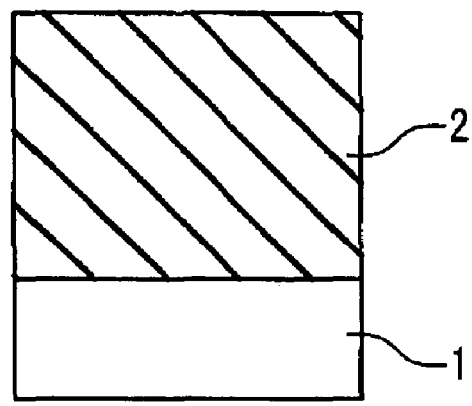
FIGS. 1 to 9 are diagrams showing a method of manufacturing a semiconductor device according to the present invention.

Hereinafter, a method of manufacturing a semiconductor device according to the present invention will be described in detail with reference to attached drawings.

The semiconductor device includes an electrically conductive portion 1, a interlayer insulating film 2, a barrier metal film 4 formed on a bottom and side wall of a contact hole which passes through the interlayer insulating film 2 to the conductive portion 1, a tungsten plug 5 filling the contact hole, and an interconnection 7 formed on the interlayer insulating film 2 and the tungsten plug 5. The manufacturing method of the semiconductor device according to the present invention contains an interlayer insulating film deposition process, an opening process, a barrier metal film deposition process, a tungsten layer deposition process, and an interconnection process.

In the interlayer insulating film deposition process, the interlayer insulating film 2 is formed on a semiconductor substrate 1. Subsequently, in the opening process, the contact hole is formed by a photolithography and a dry etching to pass through the interlayer insulating film to an electrically conductive portion of the semiconductor substrate 1. Then, in the barrier metal film deposition method, a barrier metal layer 4' is formed on a bottom portion and a sidewall portion of the contact hole by using a sputtering method. In the tungsten layer deposition process, the tungsten layer is formed of material containing fluorine to fill the contact hole and to cover the interlayer insulating film 5". A tungsten fluoride gas, especially a tungsten hexafluoride ($WF_6$) gas is exemplified as the material containing fluorine. In the tungsten layer deposition process, the $WF_6$ gas is introduced into a chamber to form the tungsten layer, and then a silicon hydride gas, e.g., monosilane (SiH4) gas is introduced to form a silicon layer on the tungsten layer. Here, fluorine contained in the tungsten layer reacts with the silicon layer formed on the tungsten layer to form a silicon fluoride film on the tungsten layer. Then, in the interconnection process, the silicon fluoride film formed on the tungsten layer is removed to form an interconnection layer.

Next, a method of manufacturing the semiconductor device of the present invention will be described with reference to FIGS. 1 to 9.

As shown in FIG. 1, the interlayer insulating film deposition process is applied to a semiconductor substrate 1 (wafer). In the interlayer insulating film deposition process, an interlayer insulating film 2 is deposited on an electrically conductive portion of the semiconductor substrate 1 such as an interconnection layer and a diffusion layer by using a conventional method.

Figure 2:
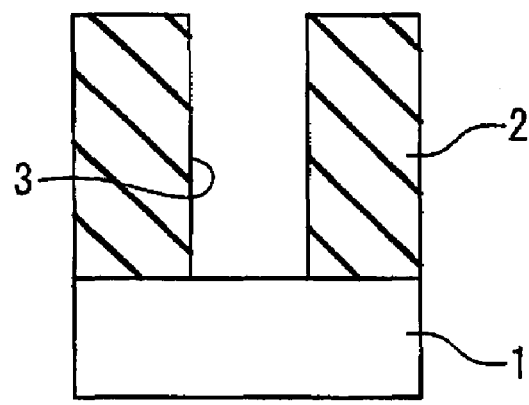

Next, the opening process is applied to the semiconductor substrate 1. As shown in FIG. 2, a contact hole 3 is formed by a photolithography method and a dry etching method to pass through the interlayer insulating film 2 to the conductive portion of the semiconductor substrate 1.

Figure 3:
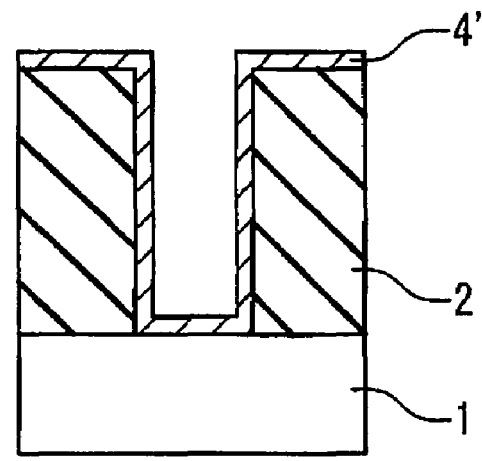

Next, the barrier metal film deposition process is applied to the semiconductor substrate 1. As shown in FIG. 3, in the barrier metal film deposition process, a barrier metal layer 4' is deposited on a bottom portion and sidewall portion of the contact hole 3 and an upper surface of the interlayer insulating film 2 by a sputtering method. A titanium nitride (TiN) layer is exemplified as the barrier metal layer 4'.

Figure 10:
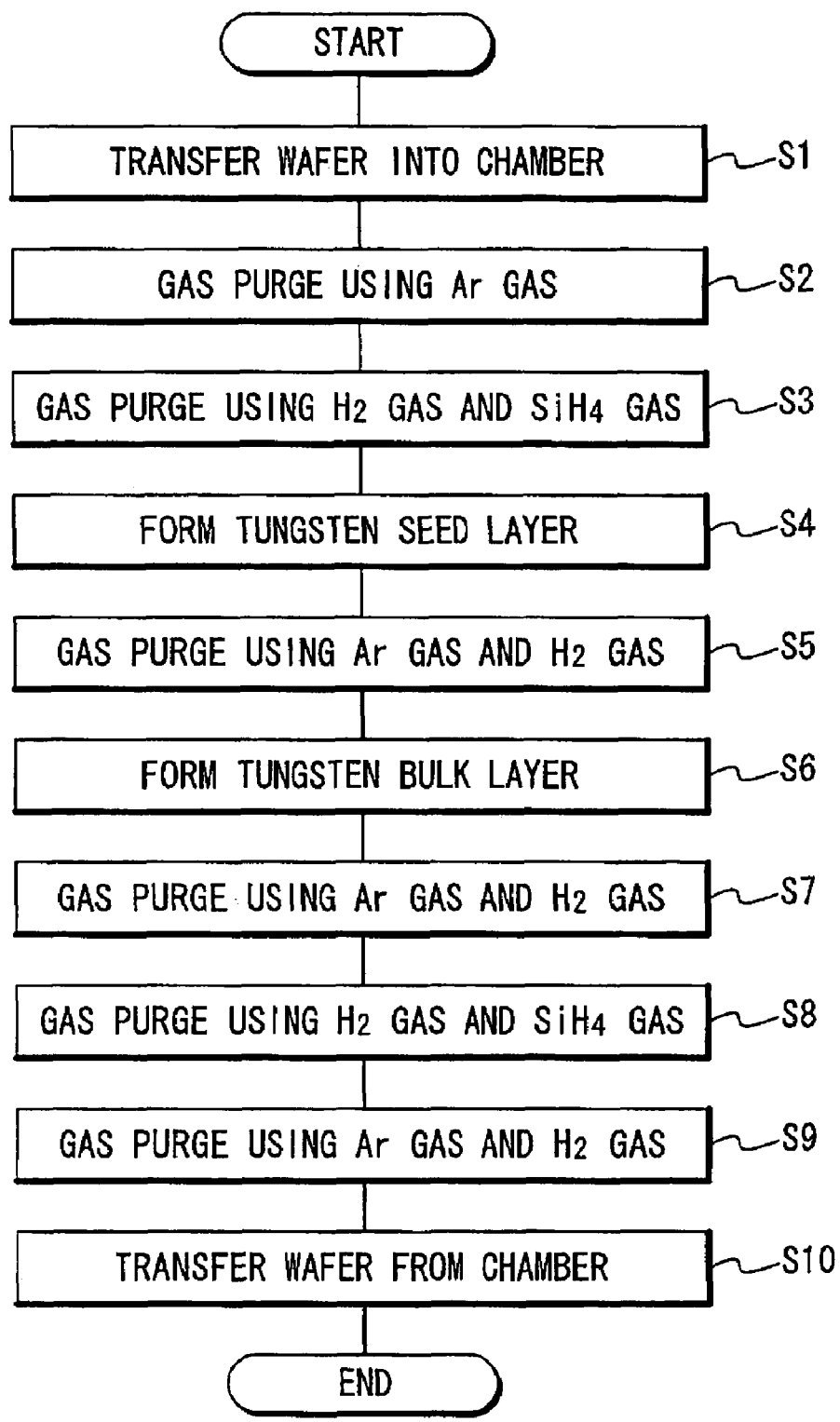
FIG. 10 is a process flow chart showing a tungsten layer deposition process.

Next, the tungsten layer deposition process is applied to the semiconductor substrate 1. FIG. 10 is a process flow chart showing the tungsten layer deposition process. As shown in FIG. 10, the semiconductor substrate 1, to which the barrier metal film deposition process has been carried out, is transferred to a vacuum chamber (not shown) for the tungsten layer deposition process (step S1 in FIG. 10). Then, an argon (Ar) gas as an inert gas is introduced into the vacuum chamber to carry out a gas purge (step S2 in FIG. 10). At this time, the gas pressure of Ar gas is 14 torr. Then, a monosilane ($SiH_4$) gas is introduced into the vacuum chamber by using a hydrogen ($H_2$) gas as a carrier gas to carry out a gas purge (step S3 in FIG. 10). At this time, the gas pressures of the $H_2$ gas and $SiH_4$ gas are 5 torr and 0.7 torr, respectively, and the step S3 is carried out for about 40 seconds. In this case, a silicon layer is formed but it is removed through the tungsten layer is formed.

Figure 4:
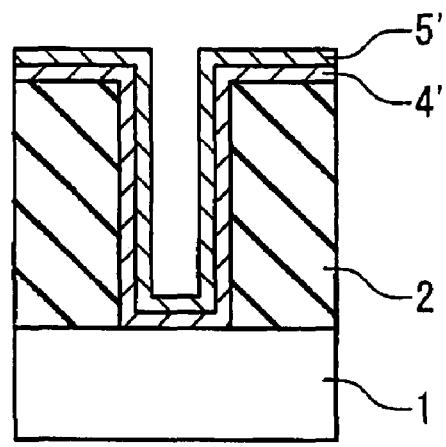

Next, a tungsten seed layer is formed at a step S4 of FIG. 10. Generally, the tungsten seed layer is formed to have the thickness of several tens of nanometers for the purpose of a smooth film deposition and adhesion to the barrier metal layer 5' (TiN film). At this time, when the tungsten seed layer is formed by using a tungsten fluoride ($WF_6$) gas as a material gas, a $SiH_4$ gas as a reducing gas and the argon gas as a carrier gas. The gas pressure of the tungsten fluoride ($WF_6$) gas introduced to the vacuum chamber is 0.3 torr, and the process time is about 10 seconds. Thus, as shown in FIG. 4, the tungsten seed layer 5' is deposited on the barrier metal layer 4'.

Next, the Ar gas as a carrier gas and the hydrogen ($H_2$) gas are introduced into the vacuum chamber to carry out a gas purge at a step S5 in FIG. 10. At the step S5, the gas pressures of the Ar gas and $H_2$ gas are 50 torr and 30 torr, respectively, and the process time is about 20 seconds.

Figure 5:
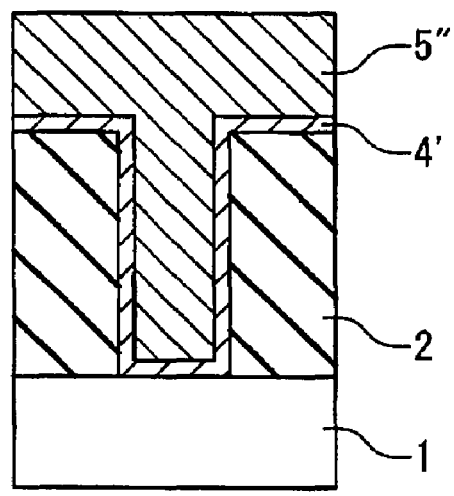

Next, the tungsten fluoride ($WF_6$) gas is introduced into the vacuum chamber at a step S6 in FIG. 10. At the step S6, the gas pressure of the $WF_6$ gas is 3 torr, and the process time is about 40 seconds. At this time, as shown in FIG. 5, a second tungsten layer as a bulk film of W is deposited on the tungsten seed layer 5' as the first tungsten layer. Thus, a tungsten layer 5" is formed as a multi-layer film. The tungsten layer 5" includes a tungsten layer (a contact plug) to fill the contact hole 3 on which the barrier metal layer 4' has been formed, and includes a tungsten layer on the interconnection plug portion and the interlayer insulating film 2.

In this way, it is preferable to reduce tungsten fluoride ($WF_6$) with silicon hydride ($SiH_4$) for the growth of the tungsten seed film and then to reduce tungsten fluoride ($WF_6$) with $H_2$ for the growth of the tungsten bulk layer. If tungsten fluoride ($WF_6$) is first reduced with $H_2$ to form the tungsten layer, it is difficult to prevent reaction of $WF_6$ with the semiconductor substrate 1 by the TiN film 4', resulting in the destruction of junction and the instability due to high junction resistance.

Next, the Ar gas as the carrier gas and the $H_2$ gas are introduced into the vacuum chamber to carry out gas purge at a step S7 in FIG. 10. At the step S7, the gas pressures of the Ar gas and $H_2$ gas are 13 torr and 7 torr, respectively, and the process time is about 7 seconds.

Figure 6:
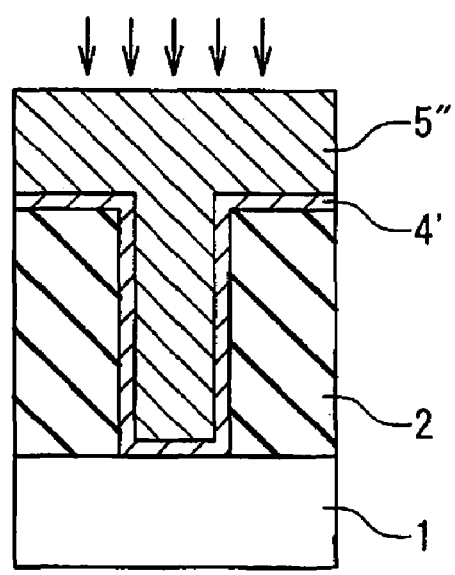
Figure 7:
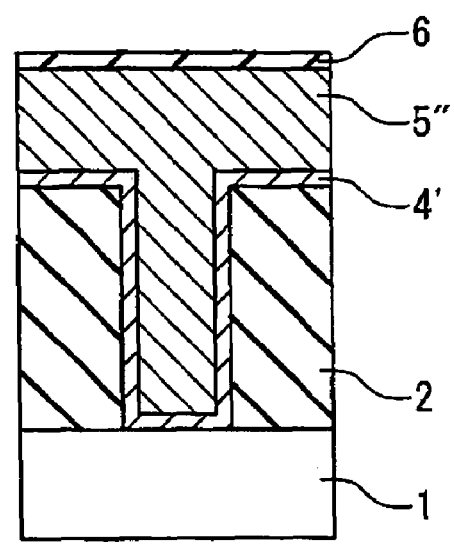
Figure 8:
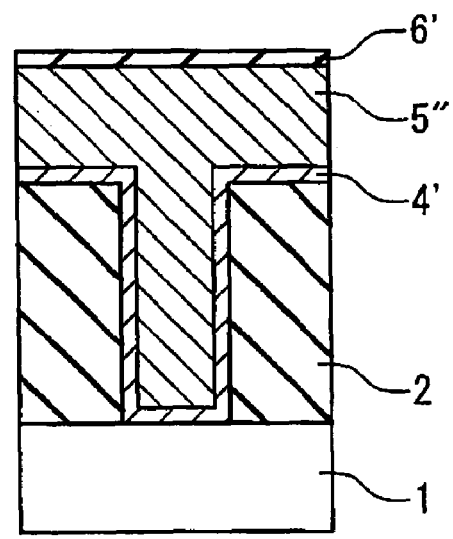

Next, the $H_2$ gas as the carrier gas and the $SiH_4$ gas as a post-purge gas are introduced into the vacuum chamber to carry out gas purge (a $SiH_4$ post-purge) at a step S8 of FIG. 10. At the step S8, the gas pressure of $SiH_4$ gas is in the range of 0.1 to 3 torr, a temperature of the semiconductor substrate 1 is in the range of 250° C. to 500° C. and the process time for the $SiH_4$ post-purge is in the range of 3 to 20 seconds. In this embodiment of the present invention, the gas pressure of $SiH_4$ gas is 0.6 torr, the temperature of the semiconductor substrate 1 is 450° C., and the time to carry out the $SiH_4$ post-purge is 7 seconds. In addition, the gas pressure of the $H_2$ gas is 4 torr. At this time, as shown in FIG. 6, the surface of the tungsten layer 5' is exposed to the $SiH_4$ gas. As a result, as shown in FIG. 7, a silicon (Si) layer 6 is deposited in grain boundary of the surface of the tungsten layer 5". In other words, the silicon layer 6 is deposited on the tungsten layer 5". As a result, as shown in FIG. 8, fluorine (F) contained in the tungsten layer 5" reacts with silicon (Si) in the silicon layer 6, and then a silicon fluoride film 6' is formed on the tungsten layer 5".

Next, the Ar gas and $H_2$ gas are introduced into the vacuum chamber to carry out the gas purge at a step S9 in FIG. 10. In the step S9, the gas pressures of the Ar gas and $H_2$ gas are 1 torr and 0.3 torr, respectively, and the process time is about 7 second.

Next, the semiconductor substrate 1 to which the tungsten layer deposition process is completed is taken out from the vacuum chamber at a step S10 in FIG. 10.

Figure 9:
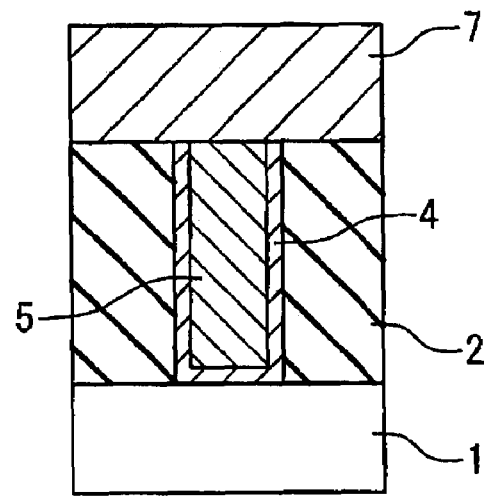

Next, the interconnection process is carried out to the semiconductor substrate 1 which has been taken out. In the interconnection process, the silicon fluoride film 6' formed on the tungsten layer 5" is removed by an etching process, and the tungsten layer 5" and the barrier metal layer 4' are etched. At this time, as shown in FIG. 9, the barrier metal layer 4 formed on the bottom portion and the sidewall part of the contact hole 3, and the tungsten layer 5 as a tungsten contact plug formed in the contact hole to which the barrier metal layer 4 is formed, are left. In the interconnection process as shown in FIG. 9, an interconnection layer 7 is formed on the barrier metal layer 4, the tungsten layer 5, and the interlayer insulating film 2.

Figure 11:
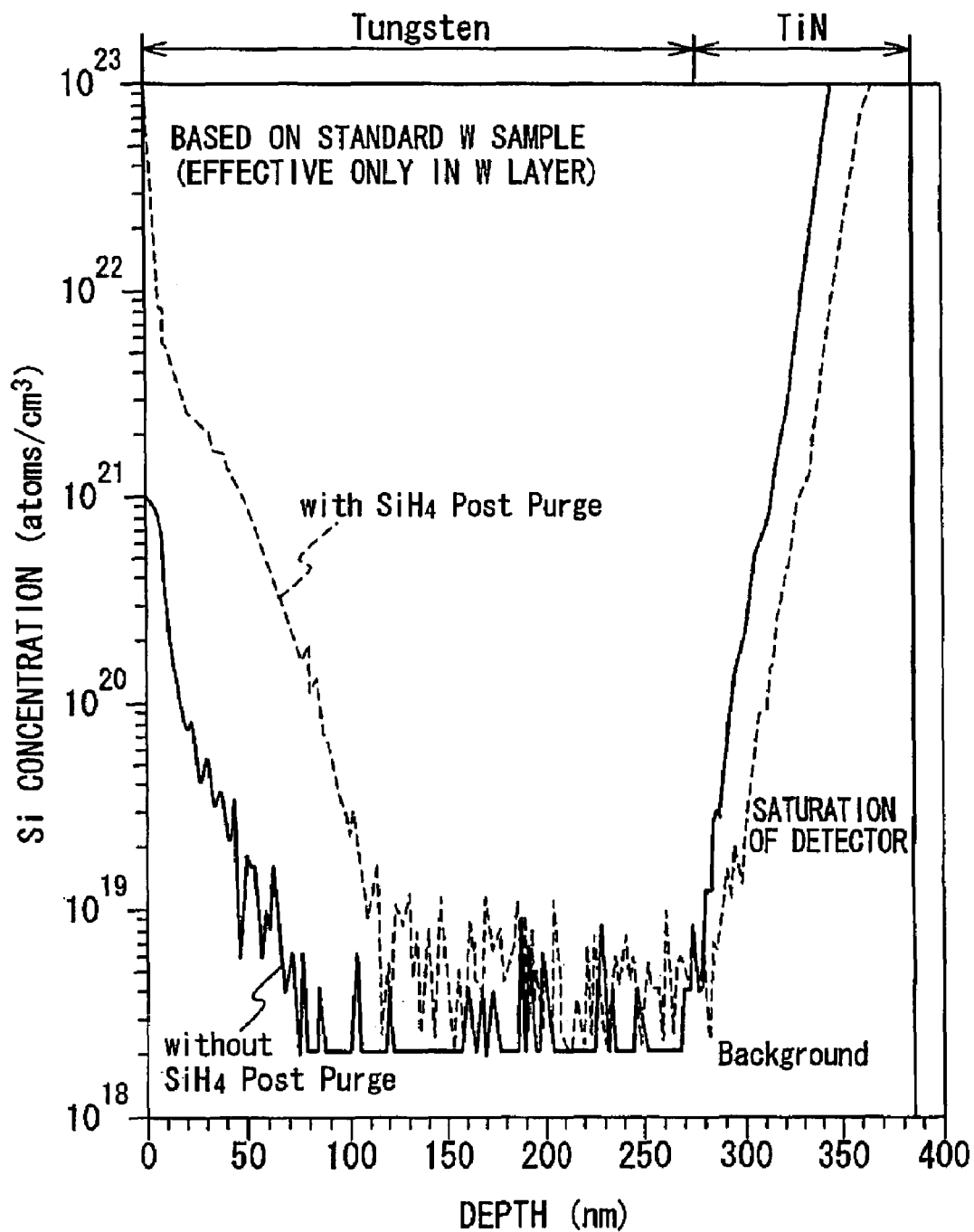
FIG. 11 is a graph showing a relation of a depth from the surface of the tungsten contact plug and silicon concentration.

FIG. 11 is a graph showing a relation of a depth from the surface of the tungsten contact plug and silicon concentration. The dotted line shows a Si concentration distribution in the manufacturing method of the semiconductor device in the present invention, whereas the solid line shows a Si concentration distribution in the conventional manufacturing method. If the $SiH_4$ post purge is carried out in the tungsten layer deposition process at the step S8, the Si concentration in an upper portion of the tungsten layer 5" becomes higher, compared with the conventional case. Thus, fluorine (F) contained in the surface portion of the tungsten layer 51" reacts with the silicon (Si) 6 easily to form a silicon fluoride film 6'.

Figure 12:
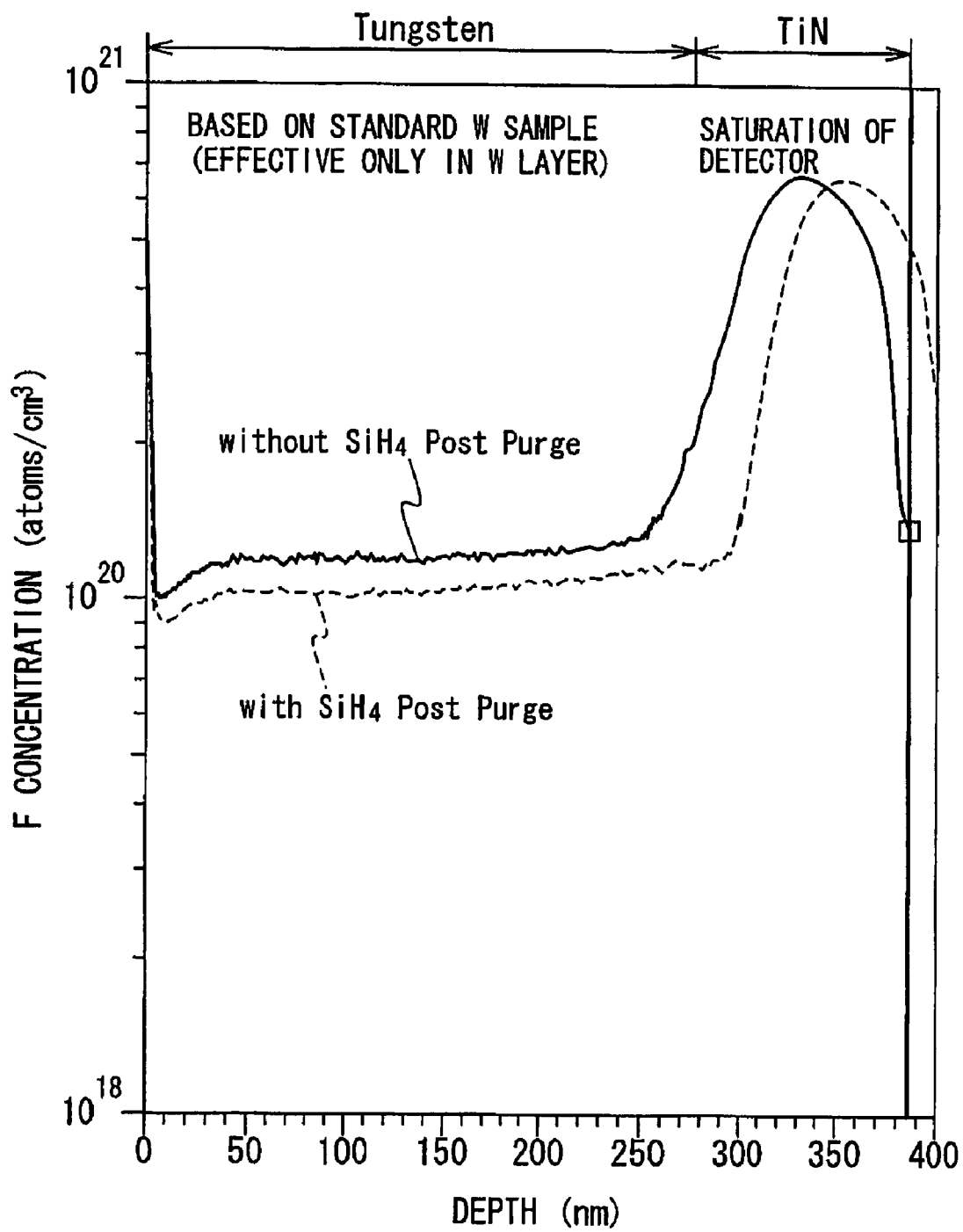
FIG. 12 is a graph showing a relation of depth and the fluorine concentration.
Figure 13:
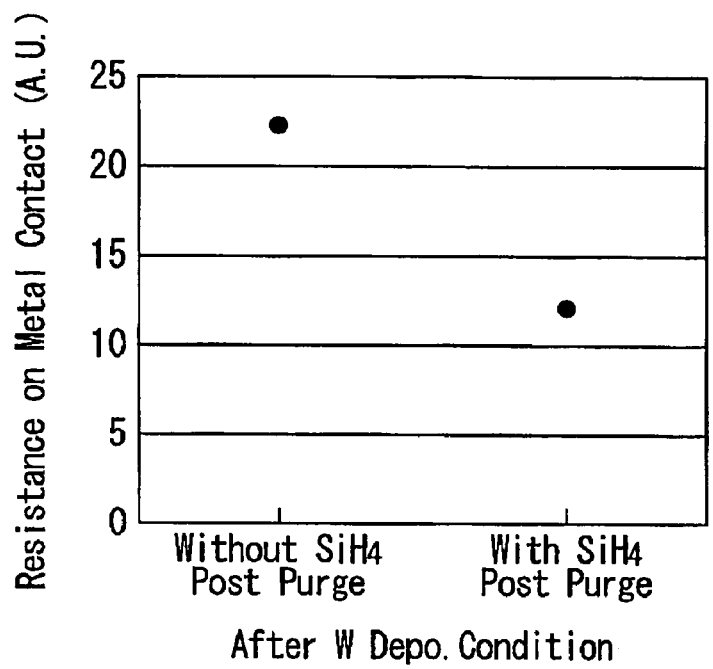
FIG. 13 is a diagram showing a comparison between the present invention and a conventional case when a tungsten plug is formed on an interconnection layer.
Figure 14:
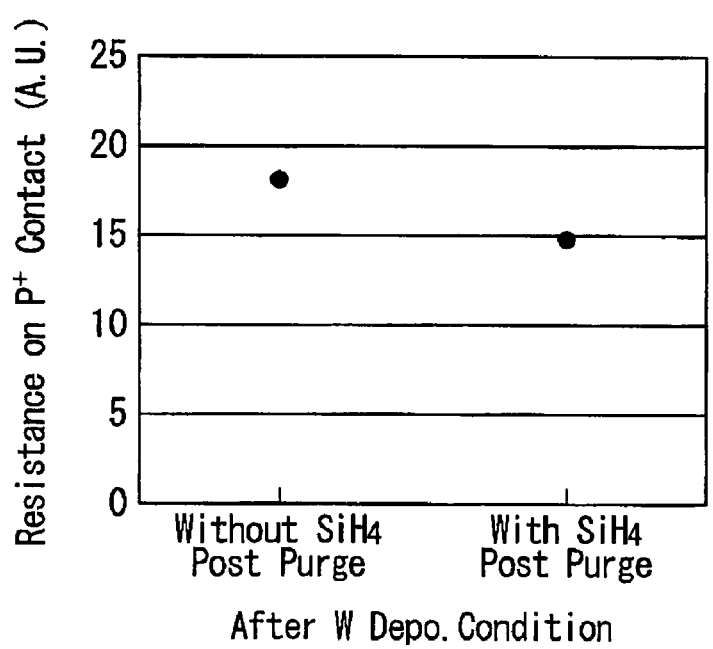
FIG. 14 is a diagram showing a comparison between the present invention and a conventional case when a tungsten plug is formed on a $P^+$-type region.
Figure 15:
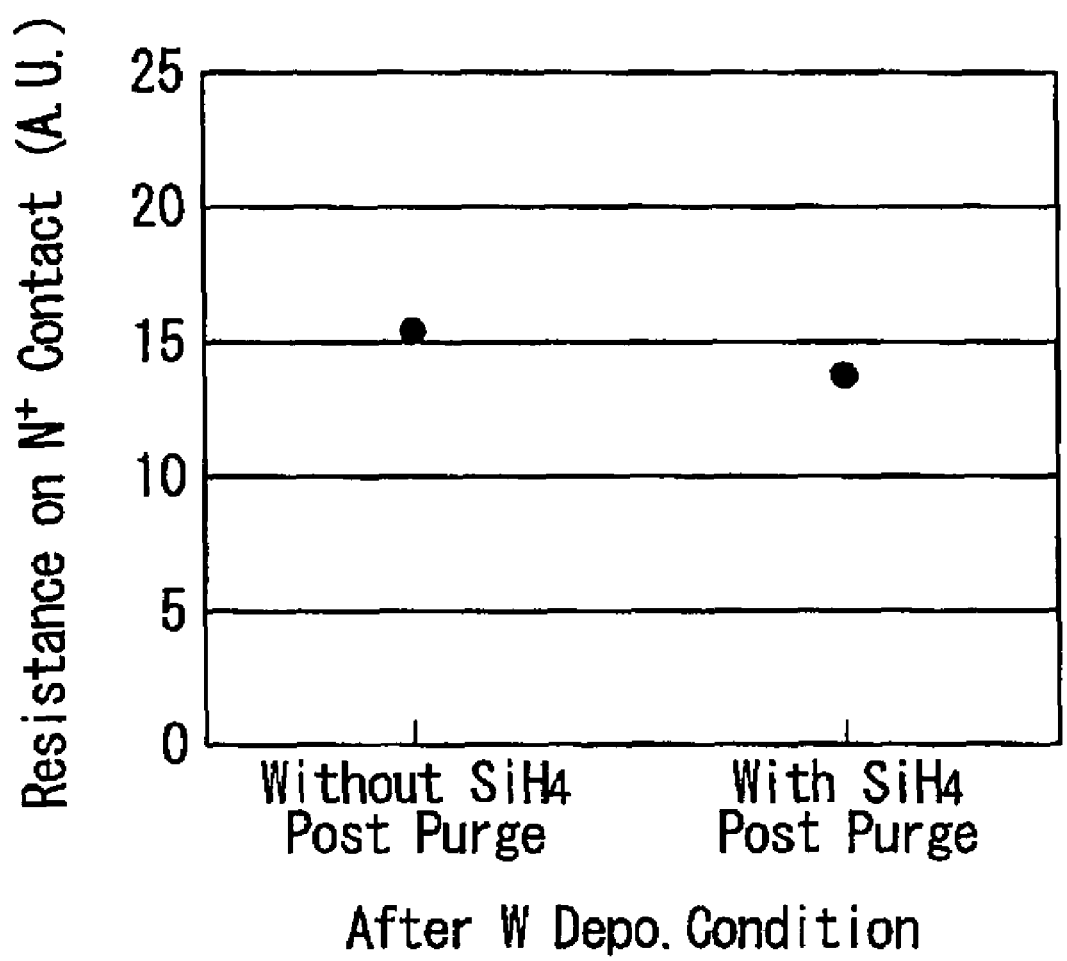
FIG. 15 is a diagram showing a comparison between the present invention and a conventional case when a tungsten plug is formed on an $N^+$-type region.

FIG. 12 is a graph showing a relation of depth and the fluorine concentration. The dotted line shows a fluorine concentration distribution in the manufacturing method of the semiconductor device in the present invention, whereas the solid line shows fluorine concentration distribution in the conventional manufacturing method. If the $SiH_4$ post purge is carried out in the step S8, the fluorine concentration contained in the tungsten layer 5" becomes lower compared with the conventional case. Thus, when the tungsten layer 5 is formed on the metal interconnection, the resistance in the interface becomes lower, compared with resistance in the conventional method, as shown in FIG. 13. Further, as shown in FIG. 14, when the tungsten layer 5 is formed on the $P^+$-type region, resistance of the tungsten layer 5 on the $P^+$-type region becomes lower compared with the conventional case. Also, as shown in FIG. 15, when the tungsten layer 5 is formed on the $N^+$-type region, resistance of the tungsten layer 5 on the $N^+$-type the tungsten layer 5 becomes lower than resistance in the conventional method.

As described above, according to the method of manufacturing the semiconductor device in the present invention, fluorine can be removed from the tungsten layer 5" by carrying out the $SiH_4$ post purge after forming the above-mentioned tungsten layer 5". In particular, fluorine can be removed from the tungsten layer 5" by introducing the SiH$_4$ gas as the silicon hydride gas for the post purge and depositing the silicon layer 6 on the tungsten layer 5. Thus, according to the method of manufacturing the semiconductor device in the present invention, it possible to restrict the increase in the resistance of the tungsten layer 5.

Further, according to the method of manufacturing the semiconductor device in the present invention, the semiconductor device can be manufactured without giving damage semiconductor elements, since the method does not use a plasma method. A technique using hydrogen plasma is conventionally known as one of techniques to remove fluorine. However, when the plasma method is used, an interconnection layer sometimes functions as an antenna to pass a large current so that the semiconductor elements are damaged. Therefore, the method of manufacturing the semiconductor device in the present invention has an advantage in no use of the plasma method.

Additionally, the method of manufacturing the semiconductor device in the present invention uses a monosilane (SiH$_4$) gas as a silicon hydride gas. However, a disilane (Si$_2$H$_6$) gas may be used in place of the monosilane (SiH$_4$) gas. Further, the Ar gas is used as the inert gas in the method of manufacturing the semiconductor device in the present invention. However, any of helium, neon, krypton, xenon and radon may also be used.

What is claimed is:

1. A method of manufacturing a semiconductor device, comprising:
    forming an interlayer insulating film on a conductive portion formed in a semiconductor substrate which is placed in a chamber;
    forming a contact hole to pass through said interlayer insulating film to said conductive portion;
    forming a barrier metal layer to cover a bottom portion and side wall portion of said contact hole;
    forming a tungsten layer from a material gas containing fluorine to fill said contact hole in which said barrier metal layer has been formed; and
    removing said fluorine from said tungsten layer through a post purge process,
    wherein said forming a tungsten layer comprises:
    introducing an inert gas into said chamber for a first gas purge;
    introducing a hydrogen gas and a silicon hydride gas into said chamber for a second gas purge after said first gas purge;
    forming a first tungsten layer of said tungsten layer from a tungsten fluoride gas after said second gas purge;
    introducing said hydrogen gas and said inert gas into said chamber for a third gas purge after said first tungsten layer is formed; and
    forming a second tungsten layer of said tungsten layer on said first tungsten layer from said tungsten fluoride gas after said third gas purge,
    wherein said removing comprises:
    introducing said hydrogen gas and said inert gas into said chamber for a fourth gas purge;
    introducing said hydrogen gas and said silicon hydride gas into said chamber for said post purge process to form a silicon layer on said tungsten layer such that silicon in said silicon layer reacts with fluorine in said tungsten layer to form a silicon fluoride layer, after said fourth gas purge;
    introducing said hydrogen gas and said inert gas into said chamber for a fifth gas purge; and
    removing said silicon fluoride layer after said fifth gas purge.

2. The method according to claim 1, wherein said forming a first tungsten layer comprises:
    introducing said silicon hydride gas and said tungsten fluoride gas into said chamber, and
    said forming a second tungsten layer comprises:
    introducing said hydrogen gas and said tungsten fluoride gas into said chamber.

3. A method of manufacturing a semiconductor device, comprising:
    forming an interlayer insulating film on a conductive portion formed in a semiconductor substrate which is placed in a chamber;
    forming a contact hole to pass through said interlayer insulating film to said conductive portion;
    forming a barrier metal layer to cover a bottom portion and side wall portion of said contact hole;
    forming a tungsten layer from a material gas containing fluorine to fill said contact hole in which said barrier metal layer has been formed; and
    removing said fluorine from said tungsten layer through a post purge process, wherein said removing comprises:
    introducing a hydrogen gas and an inert gas into said chamber for a first gas purge;
    introducing a hydrogen gas and a silicon hydride gas into said chamber for said post purge process to form a silicon layer on said tungsten layer such that silicon in said silicon layer reacts with fluorine in said tungsten layer to form a silicon fluoride layer, after said first gas purge;
    introducing said hydrogen gas and said inert gas into said chamber for a second gas purge; and
    removing said silicon fluoride layer after said second gas purge.

4. The method according to claim 1, wherein a temperature of said semiconductor substrate in said post purge process is in a range from 250° C. to 500° C.

5. The method according to claim 1, wherein a gas pressure of said silicon hydride gas in said post purge process is in a range from 0.1 torr to 3 torr.

6. The method according to claim 1, wherein a process time of said post purge process is in a range from 3 seconds to 20 seconds.

7. The method according to claim 1, wherein said silicon hydride gas is a monosilane (SiH$_4$) gas or a disilane (Si$_2$H$_6$) gas.

8. The method according to claim 1, wherein said tungsten fluoride gas is a tungsten hexafluoride (WF$_6$) gas.

9. The method according to claim 1, wherein said inert gas is any of a helium gas, a neon gas, an argon gas, a krypton gas, a xenon gas and a radon gas.

10. The method according to claim 3, wherein a temperature of said semiconductor substrate in said post purge process is in a range from 250° C. to 500° C.

11. The method according to claim 3, wherein a gas pressure of said silicon hydride gas in said post purge process is in a range from 0.1 torr to 3 torr.

12. The method according to claim 3, wherein a process time of said post purge process is in a range from 3 seconds to 20 seconds.

13. The method according to claim 3, wherein said silicon hydride gas is a monosilane (SiH$_4$) gas or a disilane (Si$_2$H$_6$) gas.

14. The method according to claim 3, wherein said tungsten fluoride gas is a tungsten hexafluoride (WF$_6$) gas.

15. The method according to claim 3, wherein said inert gas is any of a helium gas, a neon gas, an argon gas, a krypton gas, a xenon gas and a radon gas.

16. A method of manufacturing a semiconductor device, comprising:

forming an interlayer insulating film on a conductive portion formed in a semiconductor substrate which is placed in a chamber;

forming a contact hole to pass through said interlayer insulating film to said conductive portion;

forming a barrier metal layer to cover a bottom portion and side wall portion of said contact hole;

forming a tungsten layer from a material gas containing fluorine to fill said contact hole in which said barrier metal layer has been formed; and removing said fluorine from said tungsten layer by introducing a hydrogen gas and a silicon hydride gas into said chamber to form a silicon layer on said tungsten layer such that silicon in said silicon layer reacts with fluorine in said tungsten layer to form a silicon fluoride layer.

* * * * *